(12) United States Patent
Blosse

(10) Patent No.: US 6,887,784 B1
(45) Date of Patent: May 3, 2005

(54) SELF ALIGNED METAL INTERCONNECTION AND METHOD OF MAKING THE SAME

(75) Inventor: Alain Blosse, San Mateo, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/175,139

(22) Filed: Jun. 19, 2002

Related U.S. Application Data

(63) Continuation of application No. 09/595,630, filed on Jun. 15, 2000, now abandoned.

(51) Int. Cl.[7] ............................................ H04L 21/4763
(52) U.S. Cl. ...................................... 438/638; 257/621
(58) Field of Search ................................ 438/638, 637, 438/634, 639; 257/621

(56) References Cited

U.S. PATENT DOCUMENTS 5,985,746 A * 11/1999 Kapoor ........................ 438/622
6,124,201 A * 9/2000 Wang et al. ................. 438/634

* cited by examiner

Primary Examiner—David Nelms
Assistant Examiner—Quoc Hoang
(74) Attorney, Agent, or Firm—Evan Law Group LLC

(57) ABSTRACT

A method of making a structure, includes filling a via hole with a conductive material, to form a via. The via hole passes through an etch-stop opening. In both directions along a first axis dielectric material is present between the via hole and edges of the etch-stop layer, and in both directions along a second axis, perpendicular to said first axis, dielectric material is not present between the via hole and edges of the etch-stop layer.

33 Claims, 6 Drawing Sheets

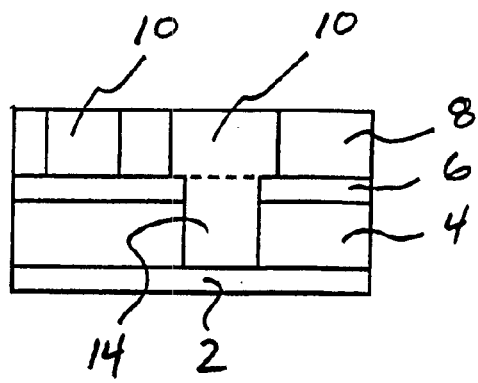
Fig. 1
CONVENTIONAL
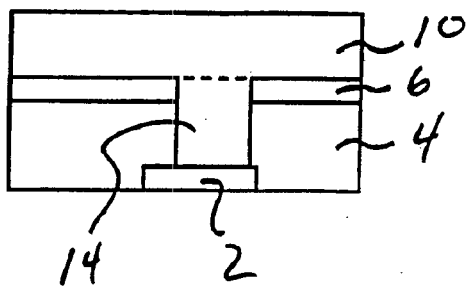
Fig. 2
CONVENTIONAL
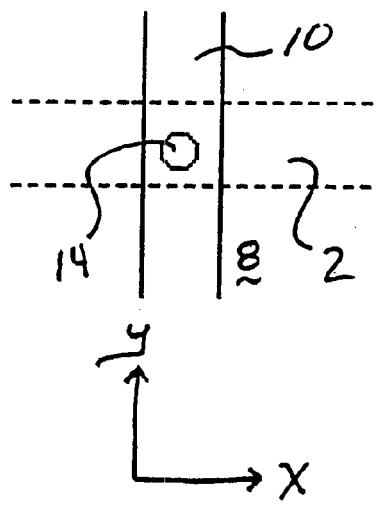
Fig. 3
CONVENTIONAL

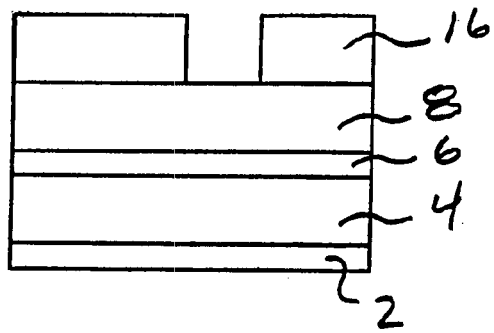
Fig. 4
CONVENTIONAL
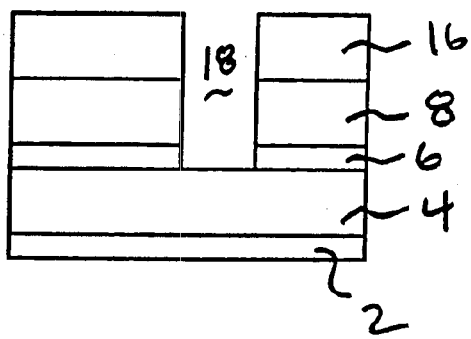
Fig. 5
CONVENTIONAL
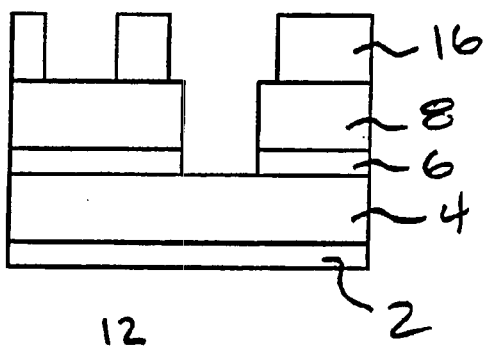
Fig. 6
CONVENTIONAL
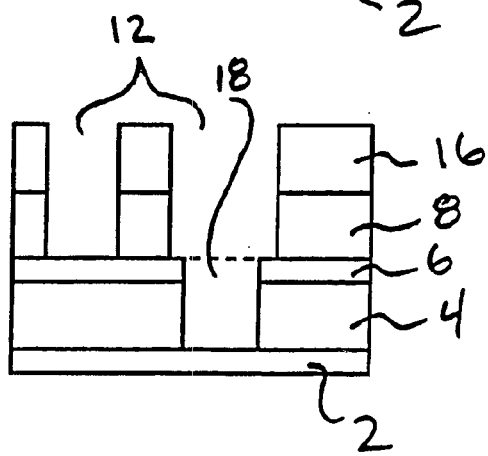
Fig. 7
CONVENTIONAL

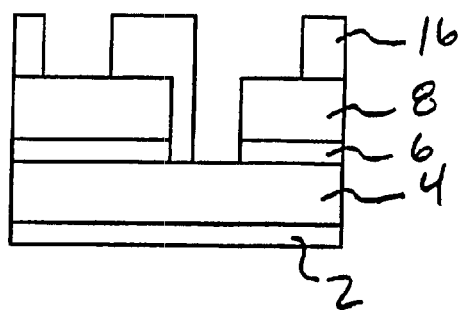
Fig. 6(b)
CONVENTIONAL
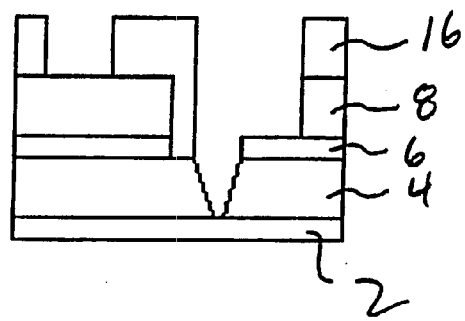
Fig. 7(b)
CONVENTIONAL

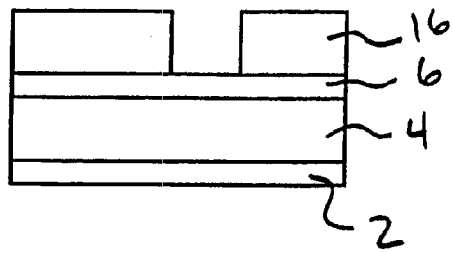
Fig. 8
CONVENTIONAL
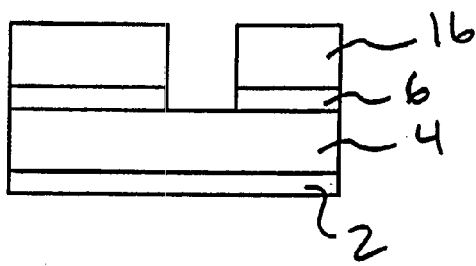
Fig. 9
CONVENTIONAL
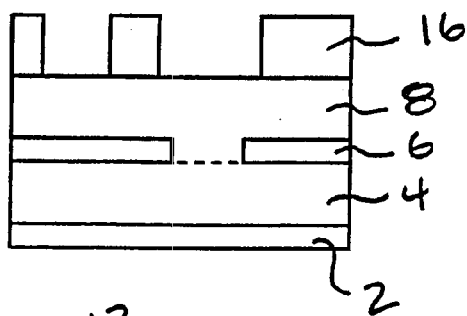
Fig. 10
CONVENTIONAL
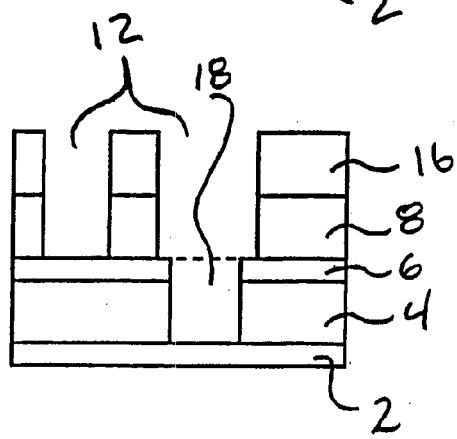
Fig. 11
CONVENTIONAL

US 6,887,784 B1

SELF ALIGNED METAL INTERCONNECTION AND METHOD OF MAKING THE SAME

CROSS REFERENCE TO RELATED APPLICATIONS

This application is a continuation of, and claims the benefit of the earlier filing date of, U.S. patent application Ser. No. 09/595,630, filed 15 Jun. 2000, now abandoned the disclosure of which is expressly incorporated herein.

BACKGROUND

The present invention relates to interconnection structures, including interlevel interconnection structures, devices containing these structures, and methods of making these structures and devices.

Typically, interconnection structures between conductive layers in an integrated circuit are known as contacts or vias (hereinafter "vias"), which are typically metallic structures that have ends in electrical contact with the conductive, layers. The vias are typically formed by depositing a dielectric layer over a first conductive layer, etching a hole through the dielectric layer, filling the holes with a conductor material to form the vias (and optionally, the overlying conductive layer), then etching or polishing away any excess conductor material. If the via material differs from that of the overlying conductive layer, then one typically forms a second conductive layer on top of the vias and the dielectric material after removing the excess via conductor material.

One approach to connecting an upper conductive layer with a lower conductive layer is called "dual damascene" or "in-laid" metallization. This approach is illustrated in FIGS. 1–3. In FIG. 3, a view from above, a lower conductive layer 2 is electrically connected to an upper conductive layer 10 by a via 14 which has one end in contact with the lower conductive layer, and the other end in contact with the upper conductive layer. The conductive layer is in-laid into an upper dielectric layer 8. The via typically has a circular cross section. In the illustration the portion of the conductive layer shown is in the pattern of a wire, but any overall pattern is possible. The x- and y-axes included in the figure indicate the orientation of the side views shown in FIGS. 1 and 2.

FIG. 1 illustrates a side view along the x-axis of FIG. 3. Shown are upper conductive layer 10, the lower conductive layer 2, the via 14, and the upper dielectric layer 8. A larger portion of the upper conductive layer is shown than in FIG. 3, and therefore more than just a wire portion of the pattern of this layer is visible. Also shown are an etch-stop layer 6, and a lower dielectric layer 4. A view perpendicular to that of FIG. 1 is shown in FIG. 2. The figures show the via electrically connecting a lower conductive layer with an upper conductive layer.

A first technique, which allows for self-alignment, is illustrated in FIGS. 4–7. Starting with FIG. 4, a photoresist layer 16 is patterned on a structure including a lower conductive layer 2, a lower dielectric layer 4 on the lower conductive layer, an etch-stop layer 6 on the lower dielectric layer, and an upper dielectric layer 8 on the etch-stop layer. The pattern of the photoresist layer is that of the cross section of the via that will be formed. Next, as shown in FIG. 5, the upper dielectric layer 8 is etched.

The photoresist layer is then removed, and a new photoresist layer 16 is formed on the structure, which is patterned, as illustrated in FIG. 6. This pattern corresponds to the cross section of the upper conductive layer. The upper and lower dielectric layers are then etched, to form the via hole 18 as well as the upper conductive layer trench 12, as illustrated in FIG. 7. Finally, the photoresist layer is removed and a conductive material is filled into the via hole and the upper conductive layer trench, to form the structures shown in FIGS. 1–3.

In this first technique, the second etching that forms the via hole and the upper conductive layer trench is difficult, since the greater the aspect ratio (i.e., height to width) of the hole, the less reliably the hole is formed. When the height of the photoresist layer is included, the aspect ratio of the via hole may be 8:1 or more. In addition, if the second photolithography step is sufficiently misaligned, photoresist may remain in the via hole in the upper insulating layer (see FIG. 6(b)), and result in a via sidewall slope that does not permit effective electrical contact between the resulting via and the underlying conductive layer (see FIG. 7(b)).

A second technique used to form these structures is illustrated in FIGS. 8–11. Starting with FIG. 8, a photoresist layer 16 is patterned on a structure including a lower conductive layer 2, a lower dielectric layer 4 on the lower conductive layer, and an etch-stop layer 6 on the lower dielectric layer. The pattern of the photoresist layer is that of the cross section of the via that will be formed. Next, as shown in FIG. 9, the etch-stop layer 6 is selectively etched to avoid etching the underlying dielectric layer.

The photoresist layer is then removed, and an upper dielectric layer 8 is formed on the structure, followed by a photoresist layer 16, which is patterned, as illustrated in FIG. 10. This pattern corresponds to the cross section of the upper conductive layer. The upper (and, where subsequently exposed, lower) dielectric layer(s) are then etched, to form the via hole 18 as well as the upper conductive layer trench 12, as illustrated in FIG. 11. Finally, the photoresist layer is removed and a conductive material is filled into the via hole and the upper conductive layer trench, to form the structures shown in FIGS. 1–3.

In this second technique, an effective via opening will depend on the accuracy of alignment between the via mask and the trench mask used to pattern the photoresist layers (earlier and later photoresist layers, respectively). Proper alignment becomes more and more difficult as the size of the structures becomes smaller and smaller, and effective via openings may be quite difficult to produce at a width of 0.18 μm and smaller.

BRIEF SUMMARY

In a first aspect, the present invention is a method of making a structure, including filling a via hole with a conductive material, to form a via. The via hole passes through an etch-stop opening. In both directions along a first axis dielectric material is present between the via hole and edges of the etch-stop layer, and in both directions along a second axis, perpendicular to said first axis, dielectric material is not present between the via hole and edges of the etch-stop layer.

In a second aspect, the present invention is a method of making a structure, including etching an etch-stop layer, to form an etch-stop opening where the etch-stop layer is on a first dielectric layer; depositing a second dielectric layer on the etch-stop layer and in the etch-stop opening; and etching the first dielectric layer and the second dielectric layer, to form a via hole through the etch-stop opening. The via hole passes through the etch-stop opening. In both directions along a first axis the second dielectric layer is present between the via hole and edges of the etch-stop layer, and in both directions along a second axis, perpendicular to the first axis, the second dielectric layer is not present between the via hole and edges of the etch-stop layer.

In a third aspect, the present invention is a semiconductor structure, including (a) a first dielectric layer, (b) an etch-stop layer having an etch-stop opening, on the first dielectric layer, (c) a second dielectric layer, on the etch-stop layer, and (d) a via, passing through the etch-stop opening. The via passes through the etch-stop opening. In both directions along a first axis the second dielectric layer is present between the via and edges of the etch-stop layer, and in both directions along a second axis, perpendicular to the first axis, the second dielectric layer is not present between the via and edges of the etch-stop layer.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 1 illustrates a side view of a conventional interconnecting structure;

FIG. 2 illustrates a side view, perpendicular to FIG. 1, of the conventional interconnecting structure;

FIG. 3 illustrates a top view of the conventional interconnecting structure;

FIGS. 4–7 illustrate sequential stages of a first technique that may be used to form the conventional structure;

FIGS. 6(b) and 7(b) illustrate sequential stages of undesirable misalignment;

FIGS. 8–11 illustrate sequential stages of another technique that may be used to form the conventional structure;

DETAILED DESCRIPTION

Figure 13:
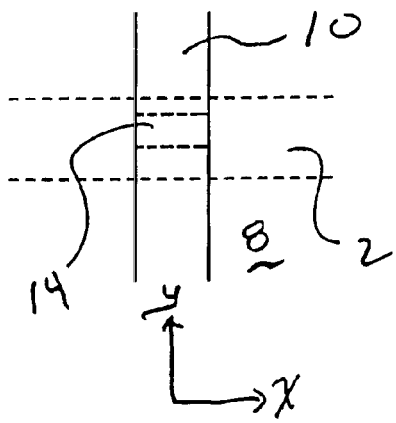
FIG. 13 illustrates a top view of the embodiment of an interconnecting structure of the present invention

FIG. 13 is a view from above of an embodiment of an interconnecting structure of the present invention. Illustrated are a lower conductive layer 2, electrically connected to an upper conductive layer 10 by a via 14 which has one end in contact with the lower conductive layer, and the other end in contact with the upper conductive layer. The upper conductive layer is in-laid into an upper dielectric layer 8. In the present invention, the via has a cross section of a rectangle, preferably a rectangle having axes of unequal length. In the illustration, the portion of the upper and lower conductive layers are shown in the pattern of a wire, but any overall pattern is possible. For example, the lower conductive layer may comprise a "landing pad" portion or section to which a via may be connected, roughly corresponding to a portion or section of a wire having an expanded width relative to other portions or sections of the lower conductive layer that will not be electrically connected to a via. Such a "landing pad" portion or section may be located at an end or terminal of the wire, at a middle portion of a wire coupling the via to two or more additional electricaly active structures, at a bend in the wire, etc.

Figure 18:
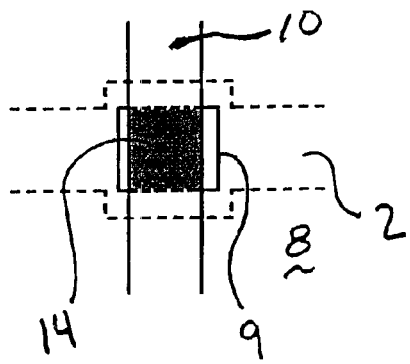
FIG. 18 is a view from above of another embodiment of an interconnecting structure of the present invention.
Figure 14:
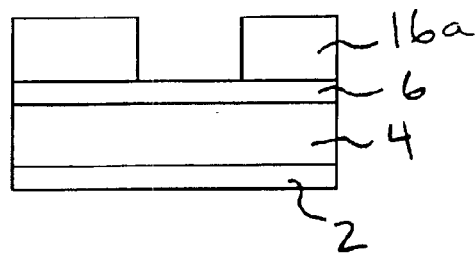
FIGS. 14–17 illustrate sequential stages of a method of the present invention that may be used to form the embodiment of an interconnecting structure of the present invention.

FIG. 18 is a view from above of another embodiment of an interconnecting structure of the present invention, similar to that illustrated in FIG. 13, except with a landing pad portion of the lower conductive layer 2 having an exaggerated width. Also illustrated in FIG. 18 is etch-stop opening 9.

The x- and y-axes included in the figure indicate the orientation of the upper conductive layer 10 shown in FIG. 13. The y-axis is generally referred to as the long wire axis of the upper conductive layer 10, and the x-axis is generally referred to as the short wire axis of the upper conductive layer 10. Preferably, the via rectangle has an axis parallel to the long wire axis (hereinafter "the y-axis of the via") that is shorter than the axis parallel to the short wire axis (hereinafter "the x-axis of the via"). Thus, the long wire axis preferably corresponds to the shortest axis of the via, and the short wire axis corresponds to the axis perpendicular to the shortest axis of the via. More preferably, the ratio of the x-axis of the via to the y-axis of the via (hereinafter "the via rectangle ratio") is at least 1.1:1 (for example, from 1.1:1 to 100:1), even more preferably at least 1.3:1 (for example, from 1.3: to 20:1), and most preferably at least 1.5:1 (for example, from 1.5:1 to 5:1).

Figure 12:
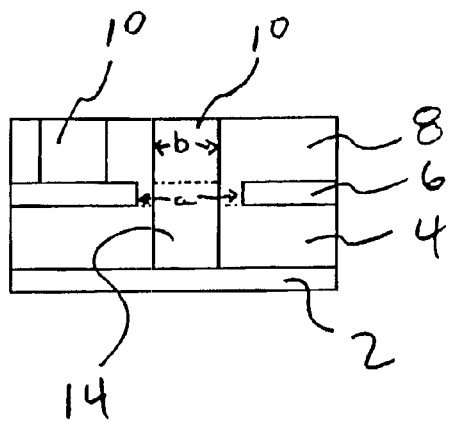
FIG. 12 illustrates a side view of an embodiment of an interconnecting structure of the present invention.

FIG. 12 illustrates a side view of the structure along the short wire axis (x-axis) of FIG. 13. Shown are upper conductive layer 10, the lower conductive layer 2, the via 14, and the upper dielectric layer 8. However, FIG. 13 shows more than one wire in the upper conductive layer in order to better illustrate an aspect of the present method. Also shown are an etch-stop layer 6, and a lower dielectric layer 4. Finally, also illustrated are: (b) a dimension in the plane of the etch-stop of the via hole, and (a) the corresponding etch-stop opening dimension. The etch-stop opening dimension is corresponding, because it lies in the same plane and the same direction (although for clarity the via hole dimension is above the plane of the etch-stop layer). Preferably the via hole dimension is smaller by at least two Lynch values.

The etch-stop layer does not make complete circumferential contact with the via, but rather a portion of the upper dielectric layer lies between at least an edge of the etch-stop layer and the corresponding surface of the via in the plane of the etch-stop layer (although other portions of the etch-stop layer may contact the via); i.e., the intersection of the etch-stop layer with the via does not form an unbroken loop. Therefore, in both directions along a first axis, dielectric material is present between the via hole and edges of the etch-stop layer, and in both directions along a second perpendicular axis, dielectric material is not present between the via hole and edges of the etch-stop layer. Preferably, a portion of the upper dielectric layer is between the edge of the etch-stop layer and the via along the short wire axis.

The figures show the via electrically connecting two conductive layers. Furthermore, a third, or even more, conductive layers are possible, over the upper conductive layer illustrated, each of which may be electrically connected with an interconnecting structure of the present invention, and separated by dielectric layers and an etch-stop layer.

An embodiment of the present invention illustrating intermediate structures formed during an exemplary method for practicing the present invention is shown in FIGS. 14–17. The orientation of these figures is the same as that of FIG.

12. Starting with FIG. 14, a photoresist layer 16a is patterned on a structure including a lower conductive layer 2, a lower dielectric layer 4 on the lower conductive layer, and an etch-stop layer 6 on the lower dielectric layer. The pattern of the photoresist layer 16a is that of the cross section of the opening in the etch-stop layer (i.e., the etch-stop opening) that is to be formed.

Figure 15:
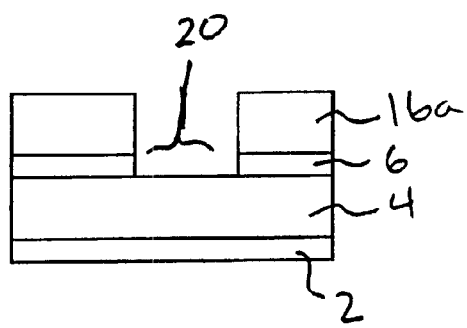

Next, as shown in FIG. 15, the etch-stop layer 6 is etched, forming an etch-stop opening 20, preferably with a rectangular shape. Preferably, this opening (corresponding to via 14 shown in FIG. 13) has a width at least 25% of the width of the lower conductive layer directly below the etch-stop opening, as measured along the y-axis of FIG. 13 (parallel to the long axis of the upper conductive layer), more preferably from 40% to 125% as wide, most preferably 50% to about 100% as wide. Similarly, etch-stop opening 20 preferably has a length at least 110% of the width of the upper conductive layer directly above the etch-stop opening, as measured along the x-axis of FIG. 13 (parallel to the short axis of the upper conductive layer), more preferably from 120% to 250% as long, most preferably 150% to about 200% as long.

Figure 16:
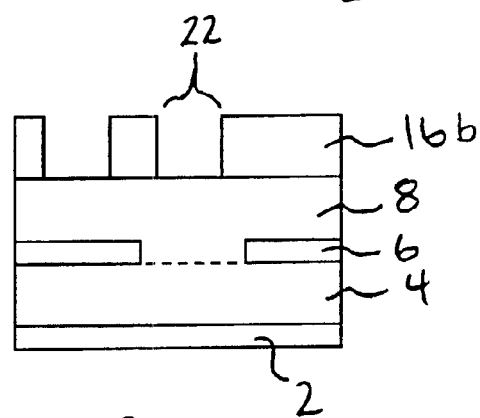
Figure 17:
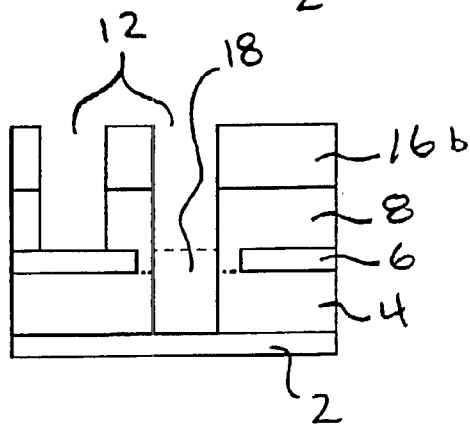

Subsequently, the photoresist layer is removed, and an upper dielectric layer 8 is formed on the structure, followed by a photoresist layer 16b, which is patterned, as illustrated in FIG. 16. This pattern corresponds to the cross section of the upper conductive layer. The width of the wire pattern opening 22 corresponds with the width of a wire in the upper conductive layer in the short wire axis direction. The upper and lower dielectric layers are then etched, to form the via hole 18 as well as the upper conductive layer trench 12, as illustrated in FIG. 17. The etch-stop layer may not make complete circumferential contact with the via hole, but rather a portion of the upper dielectric layer lies between at least an edge of the etch-stop layer and the via hole (although some portions of the etch-stop layer may contact the via hole). In other words, the intersection of the etch-stop layer with the via hole may not form an unbroken loop. Therefore the etch-stop opening has a cross section area greater than the cross section area of the via hole (and therefore also the via, once formed) in the plane of the etch-stop layer. Preferably, a portion of the upper dielectric layer is between the edge of the etch-stop layer and the via hole. Finally, the photoresist layer is removed and a conductive material is filled into the via hole and the upper conductive layer trench, to form the embodiment of an interconnecting structure of the present invention as illustrated in FIGS. 12 and 13.

The conductive layer may include any conductive material. Examples of conductive materials include metals, alloys and/or highly doped semiconductor materials. A conductive material may include, for example, Al, Cu. Au, Ag, W, Ti, Zr, Mo, Pt, Ir, Pd, Mg, Ta, Cr, Ni, Si, Ge, alloys thereof, and compounds thereof. In a preferred embodiment the conductive layer be prepared as described in "IMPROVED HOT METALLIZATION PROCESS" U.S. application Ser. No. 08/693,978, filed Aug. 1, 1996, hereby incorporated by reference.

The Lynch equation is a systematic and quantitative method of calculating the influence of both linewidth variation and misalignment on the alignment yield for two separate drawn features. For example, integration physics requires metal to overlap a contact to silicon: if the metal does not fully enclose the contact, the silicon will be exposed during the metal etch causing gouging of the silicon and degradation of the junction. The Lynch equation may be used to calculate the overlap necessary for a chosen alignment yield.

The probability that the contact feature will be fully enclosed by the metal feature can be calculated from the distributions of CD target for the contact and the metal, and the alignment tolerance of the metal to the contact. Next, it is assumed that any case where the metal does not fully cover the contact results in yield loss. Therefore, a relation between the drawn overlap and the alignment yield is now set. This gives the Lynch equation (I), where overlap is the Lynch value:

$$\text{overlap} = \sigma_f \times (B^2 + 1)^{1/2} \times \left\{ \ln\left[(1-y_a)^{-1} \times \left(\frac{1}{B^2}+1\right)^{-1/2}\right] \right\}^{1/2}, \quad (I)$$

where $$B = \frac{\sqrt{n} \times \sigma_m}{\sqrt{2} \times \left(\frac{\sigma_f}{2}\right)}$$

$\sigma_f$ = std. deviation of linewidth $\sigma_m$ = std. deviation of misalignment $n$ = number of alignments $y_a$ = alignment yield The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication 3rd. edition, Peter Van Zant, McGraw-Hill, 1997.

Any of the dielectric layers, and the etch-stop layer, may be made from a dielectric material conventionally known to those of ordinary skill in the art. The upper and lower dielectric layers may be the same, or different. Examples include conventional oxides, nitrides, oxynitrides, and other dielectrics, such as borophosphosilicate glass (BPSG), borosilicate glass (BSG), phosphosilicate glass (PSG), fluorosilicate glass (FSG), spin-on glass (SOG), silicon oxides such as silicon dioxide, and silicon nitride, for example $SiO_2$, $Si_3N_4$, $Al_2O_3$, $SiO_xN_y$, etc. The upper and lower dielectric layers must be made from a material that is different from the etch-stop layer. The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron). The etch stop layer preferably comprises silicon nitride or a silicon oxynitride, more preferably silicon nitride.

The dielectric layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, density and further improve the contact between the protection layer and the substrate.

When a dielectric layer is to be etched, it is made from a material that can be etched more quickly than the etch-stop layer. If the dielectric layer is made from silicon oxide, or a glass, such as a silicon dioxide formed from TEOS or spin-on glass (SOG), it may be doped in order to enhance the selectivity etching the glass or oxide instead of the etch-stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1. In the case of silicon oxide using silicon nitride as the etch-stop layer, an etching solution of one part HF(49%) in one part deionized water will give a selectivity of greater than 1:300.

Etching the deposited films may be conducted by conventional methods known to those of ordinary skill in the art. The specific etching method(s) and etchant(s) depend on the material being removed, the resist material and the compatibility of the etching material with the existing structure. Selection of suitable etching materials, resist materials and etching conditions, is within the level of ordinary skill in the art.

The interconnecting structure of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. In a semiconductor device, the device elements (transistors, diodes, etc., and the associated gates, sources, drains, substrates, etc.) would lie below the structures depicted in the figures. The plane containing the x- and y-axes shown in FIG. 13 would be substantially parallel to the plane of the surface of the substrate. Furthermore, any of these semiconductor devices may be incorporated in an electronic device, for example a computer, a airplane or an automobile.

The substrate may typically be a semiconductor material conventionally known by those of ordinary skill in the art. Examples include silicon, gallium arsenide, germanium, gallium nitride, aluminum phosphide, and alloys such as $Si_{1-x}Ge$, and $Al_xGa_{1-x}As$, where $0 \leq x \leq 1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

Obviously, numerous modifications and variations of the present Invention are possible in light of the above teachings. It is therefore to be understood that within the scope of the appended claims, the invention may be practiced otherwise than as specifically described herein.

What is claimed is:

1. A method of making a structure, comprising:
   filling a via hole with a conductive material, to form a via; and
   selecting an alignment yield for said semiconductor structure;
   wherein said via hole passes through an etch-stop opening in an etch-stop layer;
   in both directions along a first axis dielectric material is present between said via hole and edges of said etch-stop layer;
   in both directions along a second axis, perpendicular to said first axis, dielectric material is not present between said via hole and edges of said etch-stop layer; and
   said via hole has a dimension in the plane of the etch-stop layer smaller than the corresponding etch-stop opening dimension by at least two Lynch values.

2. The method of claim 1, further comprising, prior to said filling:
   etching an etch-stop layer, to form said etch-stop opening, wherein said etch-stop layer is on a first dielectric layer;
   depositing a second dielectric layer on said etch-stop layer and in said etch-stop opening; and
   etching said first dielectric layer and said second dielectric layer, to form said via hole.

3. The method of claim 2, further comprising depositing a conductive layer on said via.

4. A method of making a semiconductor device, comprising:
   making a semiconductor structure by the method of claim 2; and
   forming a semiconductor device from said semiconductor structure.

5. A method of making an electronic device, comprising:
   making a semiconductor device by the method of claim 4; and
   forming an electronic device comprising said semiconductor device.

6. The method of claim 1, further comprising:
   depositing a conductive layer on said via; and
   patterning said conductive layer into a pattern comprising wires.

7. The method of claim 6, wherein a long wire axis of the via is the shortest axis of the via.

8. A method of making a semiconductor device, comprising:
   making a semiconductor structure by the method of claim 7; and
   forming a semiconductor device from said semiconductor structure.

9. The method of claim 1, wherein a ratio of the length of a shortest axis of said via, to the length of an axis perpendicular to said shortest axis, is at most 1:1.1.

10. The method of claim 9, wherein said ratio is at most 1:1.3.

11. The method of claim 10, wherein said ratio is at most 1:1.5.

12. The method of claim 11, wherein said ratio is 1:5 to 1:1.5.

13. A method of making a semiconductor device, comprising:
   making a semiconductor structure by the method of claim 12; and
   forming a semiconductor device from said semiconductor structure.

14. The method of claim 1, wherein said via hole has a rectangular cross section in the plane of the etch-stop layer.

15. A method of making a semiconductor device, comprising:
   making a semiconductor structure by the method of claim 1; and
   forming a semiconductor device from said semiconductor structure.

16. A method of making an electronic device, comprising:
   making a semiconductor device by the method of claim 15; and
   forming an electronic device comprising said semiconductor device.

17. A method of making a structure, comprising:
   etching an etch-stop layer, to form an etch-stop opening, wherein said etch-stop layer is on a first dielectric layer;
   depositing a second dielectric layer on said etch-stop layer and in said etch-stop opening;
   etching said first dielectric layer and said second dielectric layer, to form a via hole through said etch-stop opening; and selecting an alignment yield for said semiconductor structure;

wherein said via hole passes through said etch-stop opening;

in both directions along a first axis said second dielectric layer is present between said via hole and edges of said etch-stop layer;

in both directions along a second axis, perpendicular to said first axis, said second dielectric layer is not present between said via hole and edges of said etch-stop layer; and said via hole has a dimension in the plane of the etch-stop layer smaller than the corresponding etch-stop opening dimension by at least two Lynch values.

18. A method of making a semiconductor device, comprising:

making a semiconductor structure by the method of claim 1; and forming a semiconductor device from said semiconductor structure.

19. A method of making an electronic device, comprising:

making a semiconductor device by the method of claim 18; and forming an electronic device comprising said semiconductor device.

20. A method of making a semiconductor device, comprising:

making a semiconductor structure by the method of claim 17; and forming a semiconductor device from said semiconductor structure.

21. A method of making an electronic device, comprising:

making a semiconductor device by the method of claim 20; and forming an electronic device comprising said semiconductor device.

22. A semiconductor structure, comprising:

(a) a first dielectric layer, (b) an etch-stop layer having an etch-stop opening, on said first dielectric layer, (c) a second dielectric layer, on the etch-stop layer, and (d) a via, passing through said etch-stop opening, wherein said via passes through said etch-stop opening, in both directions along a first axis said second dielectric layer is present between said via and edges of said etch-stop layer, in both directions along a second axis, perpendicular to said first axis, said second dielectric layer is not present between said via and edges of said etch-stop layer, and said via hole has a dimension in the plane of the etch-stop layer smaller than the corresponding etch-stop opening dimension by at least two Lynch values, and said Lynch value is determined from a selected alignment yield.

23. The semiconductor structure of claim 22, wherein said cross section of said via has a rectangular shape.

24. The semiconductor structure of claim 23, further comprising:

(3) a conductive layer on said via, wherein said conductive layer has a pattern comprising wires.

25. The semiconductor structure of claim 24, wherein a via rectangle ratio is 1.1:1 to 100:1.

26. The semiconductor structure of claim 25, wherein the via rectangle ratio is 1.3: to 20:1.

27. The semiconductor structure of claim 26, wherein the via rectangle ratio is 1.5:1 to 5:1.

28. The semiconductor structure of claim 22, wherein a ratio of the length of a shortest axis of said via, to the length of an axis perpendicular to said shortest axis, is at most 1:1.1.

29. The semiconductor structure of claim 28, wherein said ratio is at most 1:1.3.

30. The semiconductor structure of claim 29, wherein said ratio is at most 1:1.5.

31. The semiconductor structure of claim 30, wherein said ratio is 1:5 to 1:1.5.

32. An electronic device, comprising the semiconductor structure of claim 30.

33. An electronic device, comprising the semiconductor structure of claim 22.

* * * * *